United States Patent
Kraus et al.

(10) Patent No.: US 8,028,621 B2
(45) Date of Patent: Oct. 4, 2011

(54) THREE-DIMENSIONAL STRUCTURES AND METHODS OF FABRICATING THE SAME USING A PRINTING PLATE

(75) Inventors: Tobias Kraus, Saarbruecken (DE); Heiko Wolf, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 596 days.

(21) Appl. No.: 12/114,146

(22) Filed: May 2, 2008

(65) Prior Publication Data
US 2009/0272285 A1    Nov. 5, 2009

(51) Int. Cl.
*H05K 3/12* (2006.01)
*H01L 23/48* (2006.01)

(52) U.S. Cl. .......... 101/41; 101/485; 101/486; 101/491; 438/554; 438/458; 438/778; 438/780

(58) Field of Classification Search .................. None
See application file for complete search history.

(56) References Cited

U.S. PATENT DOCUMENTS

| | | | |
|---|---|---|---|
| 6,555,408 B1 | 4/2003 | Jacobsen et al. | |
| 6,623,579 B1 | 9/2003 | Smith et al. | |
| 6,683,663 B1 | 1/2004 | Hadley et al. | |
| 2005/0191448 A1 | 9/2005 | Suh et al. | |
| 2006/0003097 A1* | 1/2006 | Andres et al. | 427/212 |
| 2007/0138460 A1 | 6/2007 | Choi et al. | |
| 2007/0155184 A1 | 7/2007 | Yi et al. | |
| 2009/0278213 A1* | 11/2009 | Kraus et al. | 257/414 |

FOREIGN PATENT DOCUMENTS
WO    2005015792 A2    2/2005
WO    2006052104 A1    5/2006

OTHER PUBLICATIONS

Tobias Kraus, Laurent Malaquin, Heinz Schmid, Walter Riess, Nicholas D. Spencer and Heiko Wolf, Nanoparticle Printing with Single-Particle Resolution, Sep. 7, 2007, vol. 2, Nature Publishing Group.
Tobias Kraus, Laurent Malaquin, Emmanuel Delamarche, Heinz Schmid, Nichols D. Spencer, and Heiko Wolf, Closing the Gap Between Self-Assembly and Microsystems Using Self-Assembly, Transfer and Integration of Particles, Advanced Materials, 2005, pp. 2438-2442, Wiley-VCH Verlag GmbH & Co. KGaA, Weinheim.

* cited by examiner

*Primary Examiner* — Joshua D Zimmerman
(74) *Attorney, Agent, or Firm* — Cantor Colburn LLP; Stephen Kaufman

(57) ABSTRACT

Methods of fabricating three-dimensional structures comprise: contacting a printing plate face with a suspension comprising particles to arrange the particles at predefined positions on the printing plate face, the predefined positions comprising a first position laterally adjacent to a second position; positioning the printing plate with the printing plate face turned toward a substrate and the first position aligned to a protrusion on the substrate; contacting the protrusion with a first layer of particles disposed at the first position of the printing plate to transfer the first layer of particles to a protrusion surface; moving the printing plate laterally to align the second position to the protrusion; and contacting the first layer of particles disposed on the protrusion surface with a second layer of particles disposed at the second position of the printing plate to transfer the second layer of particles to on top of the first layer of particles.

10 Claims, 4 Drawing Sheets

THREE-DIMENSIONAL STRUCTURES AND METHODS OF FABRICATING THE SAME USING A PRINTING PLATE

BACKGROUND OF THE INVENTION

1. Field of the Invention

This invention relates to semiconductor device fabrication, and particularly to three-dimensional structures such as nanostructures and methods of fabricating the same using a printing plate.

2. Description of Background

Substantial attention has been directed to the design, implementation, and use of three-dimensional structures having well-controlled geometries and interesting optical, electrical, and/or mechanical properties. For example, three-dimensional nanostructures can comprise chemical compositions that allow them to exhibit photovoltaic, thermoelectric, diffractive, and other properties that are superior to those of other materials. Unfortunately, current methods for fabricating such three-dimensional nanostructures utilize lithography and etch processing techniques that are very complex and expensive to perform. Further, such methods are further limited by the availability of materials that can be patterned using lithography and etch techniques.

One particular type of three-dimensional structure that has received much attention is the electronic biosensor, which monitors the progress of certain biological systems. Biosensors have been described that include an array of electrode test sites in electrical connection with a plurality of conductive leads. The electrode test sites can be formed in a semiconductor wafer using photolithography and etch processing techniques. Further, the test sites can be coupled to associated detection circuitry via transistor switches using row and column addressing techniques employed, for example, in addressing dynamic random access memory (DRAM) or active matrix liquid crystal display (AMLCD) devices.

Other types of three-dimensional structures that have received much attention are photonic crystals and photonic bandgap structures. Such structures are often fabricated as two-dimensional structures because there is no economic way to fabricate them as three-dimensional structures. However, three-dimensional photonic structures are known to be much more effective. Additional types of three-dimensional nanostructures that have received increasing attention are metamaterials and thermoelectric materials. Metamaterials include a combination of different materials arranged in a defined three-dimensional geometry that causes them to exhibit extraordinary optical properties, e.g. a negative index of refraction. For visible light applications, metamaterials can require nanoscale building blocks.

There are ongoing efforts to increase the density of electrode arrays by reducing electrode and overlying lead or contact sizes to nanometer- or micrometer-scale dimensions, thereby producing "microelectrode arrays" (MEAs). However, it has been difficult to produce MEAs with very small dimensions using current top-down semiconductor fabrication methods. For example, current photolithography and etch techniques can be employed to pattern openings or vias in an insulation layer formed above the electrodes before filling those vias with a conductive material to form contacts to the electrodes. However, the ability of the photolithography and etch techniques to pattern small features is restricted by factors such as the resolution limits of the optical lithography system.

It is therefore desirable to develop a less demanding, inexpensive method for producing a large number of three-dimensional structures, particularly structures of small dimensions such as photonic crystals, nanostructures, metamaterials, microelectrode arrays, etc. It is further desirable to increase the number of materials available for forming such three-dimensional structures.

SUMMARY OF THE INVENTION

The shortcomings of the prior art are overcome and additional advantages are provided through the provision of methods of fabricating three-dimensional structures, such as nanostructures, using printing plates to arrange particles in alignment. In one embodiment, a method of fabricating a three-dimensional structure comprises: contacting a face of a printing plate with a suspension comprising particles to arrange the particles at predefined positions on the face of the printing plate, wherein the predefined positions comprise a first position laterally adjacent to a second position; positioning the printing plate with the face of the printing plate turned toward a substrate and the first position aligned to a protrusion on the substrate; contacting the protrusion with a first layer of particles disposed at the first position of the printing plate to transfer the first layer of particles to a surface of the protrusion; moving the printing plate laterally to align the second position to the protrusion; and contacting the first layer of particles disposed on the surface of the protrusion with a second layer of particles disposed at the second position of the printing plate to transfer the second layer of particles to on top of the first layer of particles.

In another embodiment, a topography comprising a three-dimensional structure comprises: a substrate comprising a first protrusion laterally spaced from a second protrusion; and nanoparticles stacked upon the first and second protrusions to form a three-dimensional shape on each protrusion.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
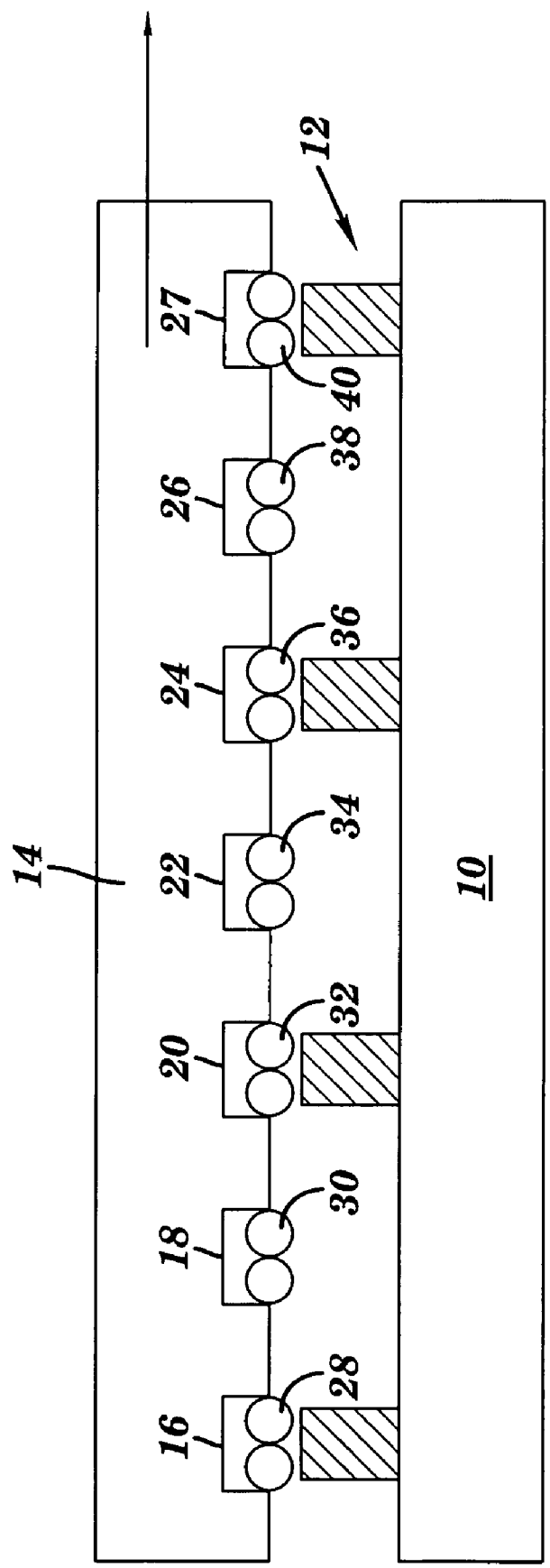
FIGS. 1-3 illustrate one example of a fabrication method in which a printing plate is used to from three dimensional structures comprising particles stacked upon protrusions formed on a substrate.
Figure 2:
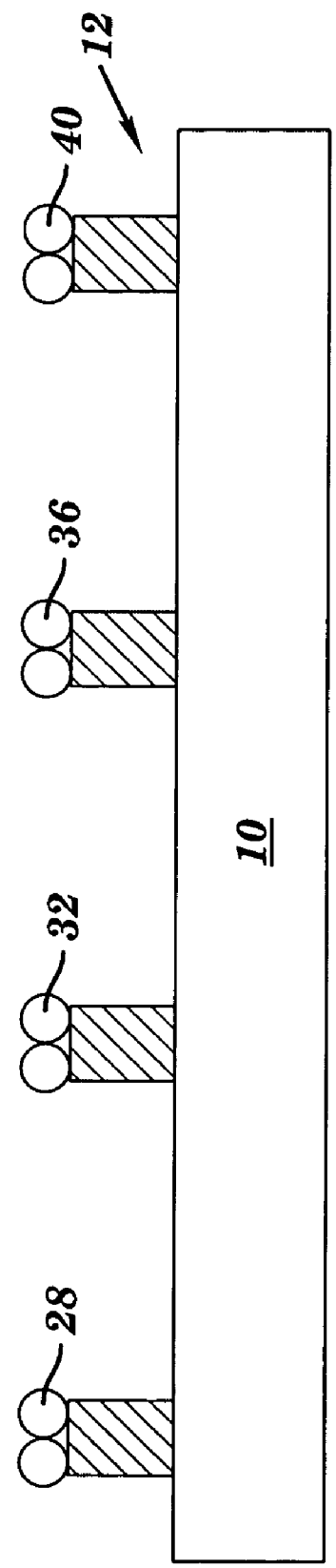
Figure 3:
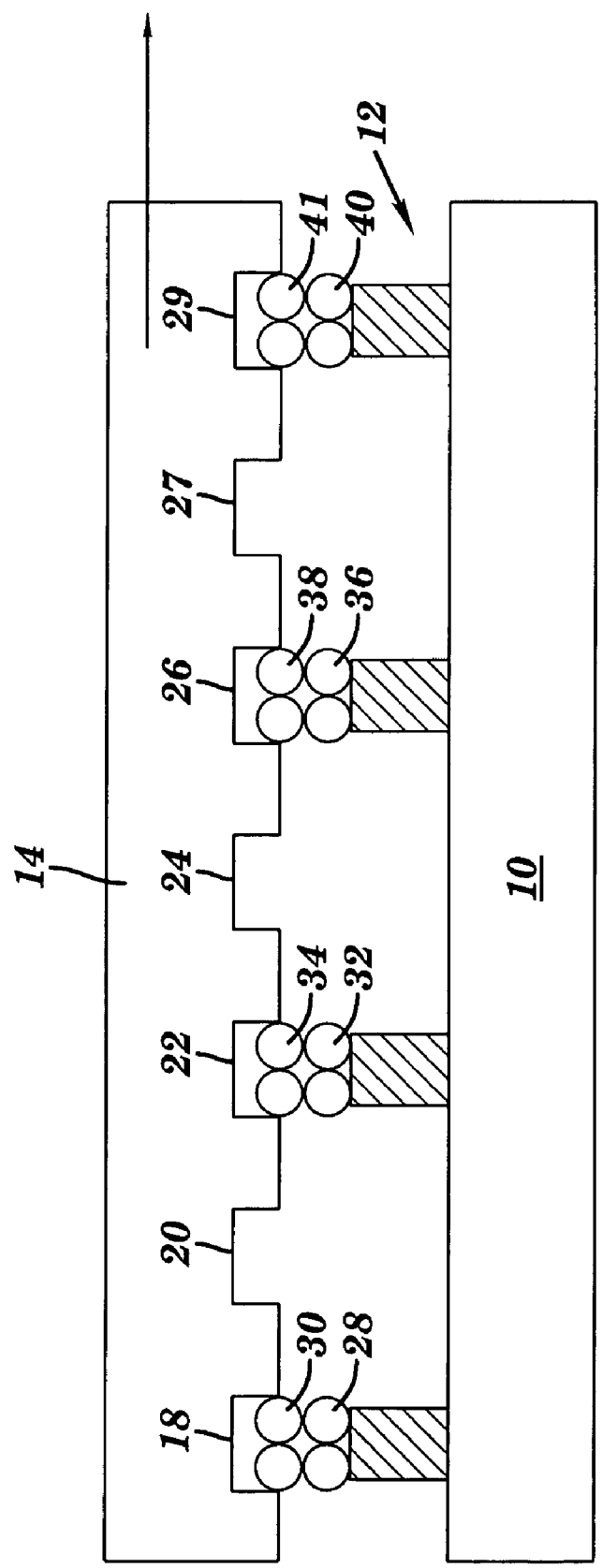

Turning now to the drawings in greater detail, it will be seen that FIGS. 1-3 illustrate an exemplary embodiment of a method for fabricating three-dimensional structures using a printing plate to arrange particles stacked upon protrusions extending above a substrate. This method can be used to economically print small particles, such as nanoparticles, on top of each other to build three-dimensional structures having complex and well-defined geometries. The additive nature of this method and the intrinsic alignment promotes the formation of such superstructures more rapidly and efficiently than current subtractive methods without the need to perform complex lithography and etch steps and without the need for a vacuum. Further, the particles forming the three-dimensional structures can comprise any material capable of being prepared as a colloidal suspension.

Turning now to FIG. 1, a substrate 10, e.g., a semiconductor substrate or a silicon-on-insulator (SOI) substrate, is shown upon which a material has been deposited and patterned (e.g., through the use of photolithography and an anisotropic etch technique such as reactive ion etching) to form protrusions 12 that extend above the substrate 10. Alternatively, the protrusions can be anisotropically etched in the substrate itself. The protrusions 12 are laterally spaced from each other and have relatively small heights. The heights of such protrusions can vary with the particle size and the overall geometry (e.g. the lateral density) of the protrusions. For example, the heights of the protrusions, h, can be about equivalent to or greater than the corresponding particle diameter, $d(h \geq d)$. Further, the farther apart the protrusions are placed from each other, the greater their heights can be to prevent the printing plate from making contact between the protrusions. In addition, the lateral dimensions of the protrusions are desirably larger than their heights.

The protrusions 12 can be formed from various materials depending on their application. For example, they can be formed of a conductive material, e.g., copper, gold, or silver, such that they form an array of electrodes upon a semiconductor substrate. They can also be formed of the same material as the substrate 10. As a result, the protrusions 12 can be fabricated using current semiconductor fabrication processes. Further materials that the protrusions can be formed of include but are not limited to semiconductor materials, polymers, metal oxides, semiconductor oxides, and nitrides. In another embodiment, the protrusions can comprise a sacrificial layer to allow the printed three-dimensional particle structures to be removed and collected from the protrusions by dissolving the sacrificial layer. Examples of suitable sacrificial layers include but are not limited to polymers such as polyacrylates, polymethacrylates such as polymethylmethacrylate (PMMA), polystyrene (PS), and combinations comprising at least one of the foregoing polymers.

Also shown in FIG. 1 is a printing plate 14 that includes recessed features 16, 18, 20, 22, 24, 26, and 27 spaced laterally apart on the face of the printing plate 10. The printing plate 14 can include a molded material that can replicate a three-dimensional relief structure by a molding process. Examples of suitable molded materials include but are not limited to as silicone, elastomers that can replicate a three-dimensional relief structure by a molding process (e.g. fluorinated polyethers), and combinations comprising at least one of the foregoing. The position of every other recessed feature (i.e., features 16, 20, 24, and 27) in the printing plate 14 can be pre-selected to correspond with the location of one of the protrusions 12 extending above substrate 10. Particles 28, 30, 32, 34, 36, 38, and 40 (28-40) can be embedded in the recessed features 16, 18, 20, 22, 24, 26, and 27 (16-27), respectively, using a directed assembly method. That is, the particles 28-40 can be strategically placed in the recessed features 16-27 by placing a suspension comprising particles dispersed therein in contact with the face of the printing plate 14. As the suspension is moved over the printing plate 14, e.g., on a movable stage, particles 28-40 become embedded in the recessed features 16-27 of the printing plate 10. When the particles 28-40 have assumed their desired positions, the remaining suspension liquid can be removed to form a dry, filled printing plate 14 that can be stored until it is desirable to transfer the particles 28-40 to a substrate. It is understood that the number of particles embedded in each recessed feature 16-27 (two are shown) can vary depending on the desired shape and size of the three-dimensional structures being formed. In another embodiment, the particles can be captured in protruding structures on the printing plate such as corners having 90° angles. In yet another embodiment, the particles can be captured on binding sites on the printing plate having chemical functionalities that specifically attract and bind the particles. Examples of such chemical functionalities include but are not limited to polyelectrolytes.

The above-mentioned particle suspension can be formed by first chemically synthesizing particles having well-defined shapes and relatively narrow size distributions in the presence of surfactants to prevent the agglomeration of such particles. By way of example, conductive particles can be synthesized by the reduction of metal salts, and polymer particles can be synthesized by emulsion polymerization. The synthesized particles can be mixed with a liquid to form the suspension. Examples of suitable liquids include but are not limited to ink, water, aqueous solutions comprising surfactants, alcohols (e.g., methanol, ethanol, propanol, and 2-propanol), and combinations comprising at least one of the foregoing (e.g., a water/alcohol mixture). The amount of particles present in the liquid can be about 0.01 to about 40% by weight, specifically about 0.01 to about 20% by weight, more specifically about 0.05 to about 10% by weight, and even more specifically about 0.1 to about 5% by weight.

In one embodiment, the particles have a grain size dimension of less than or equal to about 100 micrometers (microns), more specifically less than or equal to about 100 nanometers (nm—particles of this size are referred to as "nanoparticles"), to allow for the formation of microstructures or nanostructures. The term "grain size dimension" is herein defined as any straight lined segment that passes through the center of the particle and has its end points positioned at the surface of the particle. Suspensions comprising nanoparticles are considered to be "colloidal" suspensions. Further, the particles have a Coefficient of Variation (C.V.) of less than about 5%, more specifically less than about 3%. Although the particles in FIG. 1 are depicted as being substantially spherical shaped, they can have other geometries such as cube shaped, rod shaped, or wire shaped.

FIG. 1 specifically depicts the transfer of the particles 28, 32, 36, and 40 embedded in every other recessed feature (i.e., features 16, 20, 24, and 27) of the printing plate 14 to the top of the protrusions 12 disposed on the substrate 10. This transfer occurs as a result of positioning the printing plate 14 with its face turned toward the underlying substrate 10 such that particles 28, 32, 36, and 40 are aligned to protrusions 12. The printing plate 14 can then be brought in contact with the substrate 10. Due to the presence of the protrusions 12 on the substrate, only those particles that come into contact with the protrusions 12 are transferred to form a first layer of particles on each protrusion 12. The particles 30, 34, and 38 disposed in the recessed features 18, 22, and 26 of the printing plate 14 do not come into contact with the underlying substrate 10 and thus remain therein after the printing plate 14 is moved laterally away from the substrate 10. FIG. 2 depicts the substrate 10 having protrusions 12 and a first layer of particles disposed thereon after the retraction of the printing plate 14. The movement of the printing plate 14 can be controlled using a high-precision actuator capable of precise in-plane motion such as a piezoelectric actuator that can produce a small displacement with a high force capability when voltage is applied. Physik Instrumente Gmbh and Co. sells suitable PI piezoelectric actuators such as the P-752 actuator, which has a 0.1 nm resolution.

Figure 4:
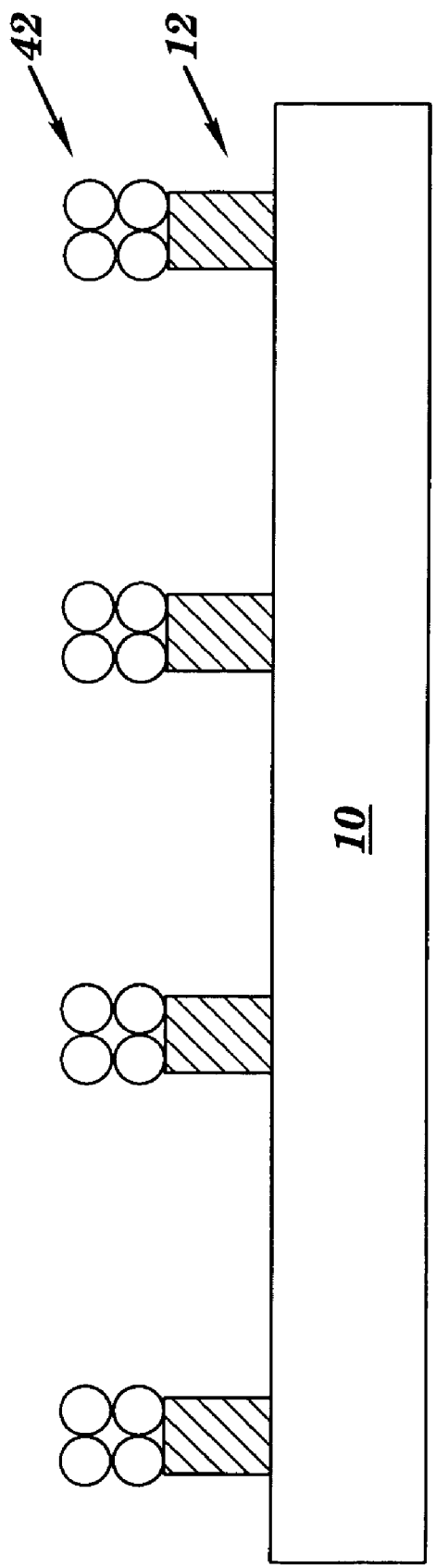
FIG. 4 illustrates one example of a device comprising three-dimensional structures in which particles are stacked upon protrusions formed on a substrate.

Next, as illustrated in FIG. 3, the printing plate 14 can be moved laterally back to its position facing the substrate 10 but this time with particles 30, 34, 38, and 41 (those particles adjacent to the particles previously transferred from the printing plate) aligned to the protrusions 12 on the substrate 10. The printing plate 14 can be placed such that particles 30, 34, 38, and 41 contact and sit on the first layer of particles 28, 32, 36, and 40 disposed on the surfaces of the protrusions 12. The printing plate 14 can then be moved laterally away from the substrate 10, leaving behind particles 30, 34, 38, and 41, which form a second layer of particles on top of the first layer of particles disposed on protrusions 12 above the substrate 10. These multiple layers of particles form three-dimensional structures 42 on the protrusions 12, as shown in FIG. 4.

The particles described above can adhere to the protrusions and to already printed particles. In the case of polymer particles, this adhesion can be improved by printing at elevated temperatures to soften the particles and thus create higher adhesion to the protrusions and to already printed particles than to the printing plate. Other particle materials may require a thin adhesive layer that can be applied in between the printing steps or onto the particles assembled in the printing plate before the first printing step.

The process described above of printing layers of particles on protrusions extending above a substrate can be repeated to build various types of three-dimensional structures on a substrate. For example, three-dimensional structures can be built on a substrate in the shape of a pyramid, a cube, a rectangular solid, or combinations comprising at least one of the foregoing shapes. The design of the printing plate could be modified based on the desired number of layers and particles per layer in the final three-dimensional structures. Since a high-precision actuator controls the motion of the printing plate, the layers of the three-dimensional structures can be automatically aligned. After the first alignment of the printing plate 14 to the protrusions 12, only in-plane movements relative to the starting position are necessary to print the following layers at the desired positions. Such relative movements can be done very precisely.

Particles comprising different compositions can be printed in one process by arranging different particles in different predefined positions of the printing plate before contacting the substrate with the printing plate. For example, the particles disposed in adjacent recessed features of the printing plate 14 shown in FIG. 1 (e.g., particles 28 and 30) could have different compositions. As a result, the particles disposed in the first layer and those disposed in the second layer on top of one protrusion 12 can have different compositions.

The particles described above can be functionalized with inorganic salts or ions such as calcium, chloride, inorganic phosphorous, potassium, selenium, and sodium; proteins such as poly-L-lysine, laminin, bilirubin, albumin, insuline, hemoglobin, collagen, fibronectin, and fibrinogen; enzymes such as alkaline phosphatase, lactate dehydrogenase, and glutamate oxalacetate transaminase; carbohydrates such as glucose; lipids such as triglycerides nucleic acids, e.g., DNA, RNA, m-RNA, t-RNA, or selected portions thereof; vitamins such as beta-carotene, bioflavonoids, biotin, choline, CoQ-10, essential fatty acids, folic acid, hesperidin, inositol, para-aminobenzoic acid, rutin, vitamin A, vitamin B complex, vitamin B-1 thiamine, vitamin B-2 riboflavin, vitamin B-3 niacin/niacinamide, vitamin B-5 pantothenic acid, vitamin B-6 pyridoxine, vitamin B-9 folic acid, vitamin B-12 cyano-cobalamine, vitamin B-15 dimethylglycine, vitamin B-17 leatrile or amygdalin, vitamin C, vitamin D, vitamin E, vitamin F unsaturated fats, vitamin G, vitamin J, vitamin K, and vitamin P; antibodies such as immunoglobulin A, immunoglobulin D, immunoglobulin E, immunoglobulin G, and immunoglobulin M; steroids and hormones such as cholesterol, cortisol, follicle stimulating hormone, growth hormone, leutinizing hormone, platelet-derived growth factor, fibroblast growth factor, parathyroid hormone, progesterone, prolactin, prostaglandins, testosterone, and thyroid stimulating hormone; aminoacids such as alanine, arginine, asparagine, aspartic acid, cysteine, glutamine, glutamic acid, glycine, histidine, isoleucine, leucine, lysine, methionine, phenylalanine, proline, serine, threonine, tryptophan, and valine; and aminoacid derivatives such as creatine.

In one embodiment, chemical functionalization of the particles is achieved by pre-treating the surface of the particles with a solution of a chemical moiety (e.g., proteins such as poly-L-lysine and laminin) in water for a duration of, for example, 2 hours. In another embodiment, the particles are treated after they have been printed.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a three-dimensional structure, comprising:
   contacting a face of a printing plate with a suspension comprising particles to arrange the particles at predefined positions on the face of the printing plate, wherein the predefined positions comprise a first position laterally adjacent to a second position;
   positioning the printing plate with the face of the printing plate turned toward a substrate and the first position aligned to a protrusion on the substrate;
   contacting the protrusion with a first layer of particles disposed at the first position of the printing plate to transfer the first layer of particles to a surface of the protrusion;
   moving the printing plate laterally to align the second position to the protrusion; and
   contacting the first layer of particles disposed on the surface of the protrusion with a second layer of particles disposed at the second position of the printing plate to transfer the second layer of particles to on top of the first layer of particles.

2. The method of claim 1, wherein the particles have a grain size dimension of less than or equal to about 100 micrometers.

3. The method of claim 1, wherein the particles have a grain size dimension of less than or equal to about 100 nanometers.

4. The method of claim 1, further comprising moving the printing plate laterally away from the substrate subsequent to said contacting the protrusion with the first layer of particles.

5. The method of claim 4, wherein said moving the printing plate laterally to align the second position to the protrusion comprises moving the printing plate back toward the substrate after said moving the printing plate laterally away from the substrate.

6. The method of claim 1, wherein the printing plate is in communication with a piezoelectric actuator for laterally moving the printing plate to a precise position.

7. The method of claim 1, wherein the predefined positions on the face of the printing plate comprise recessed features, protruding structures, binding sites, or a combination comprising at least one of the foregoing.

8. The method of claim 1, wherein the particles comprise a conductive material and the protrusions are electrodes formed upon a semiconductor substrate.

9. The method of claim 1, wherein the protrusion comprises a conductive material, a semiconductor material, a polymer, a metal oxide, a semiconductor oxide, a nitride, or a combination comprising at least one of the foregoing.

10. The method of claim 1, wherein the particles are substantially cube shaped, spherical shaped, rod shaped, or wire shaped, and wherein the particles comprise a conductive material, a polymer, a conductive material functionalized with an inorganic ion, a protein, an enzyme, a nucleic acid, a vitamin, an antibody, a steroid, a hormone, or an aminoacid, or a combination comprising at least one of the foregoing.

* * * * *